United States Patent
Volk et al.

(10) Patent No.: US 7,541,115 B1
(45) Date of Patent: Jun. 2, 2009

(54) USE OF CALCIUM FLUORIDE SUBSTRATE FOR LITHOGRAPHY MASKS

(75) Inventors: William Volk, San Francisco, CA (US); Laurence Wagner, McKinney, TX (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 553 days.

(21) Appl. No.: 11/075,993

(22) Filed: Mar. 9, 2005

Related U.S. Application Data

(60) Provisional application No. 60/628,176, filed on Nov. 15, 2004.

(51) Int. Cl.
  *G03F 1/00* (2006.01)
  *G03C 5/00* (2006.01)
(52) U.S. Cl. .......................................... 430/5; 430/394
(58) Field of Classification Search ............... 430/5, 430/394; 428/428, 430; 425/174.4
  See application file for complete search history.

(56) References Cited

U.S. PATENT DOCUMENTS

| | | | |
|---|---|---|---|
| 5,484,671 A | 1/1996 | Okamato | |
| 6,364,946 B2 | 4/2002 | Staeblein et al. | 117/81 |
| 6,517,977 B2 * | 2/2003 | Resnick et al. | 430/5 |
| 6,653,024 B1 * | 11/2003 | Shiraishi et al. | 430/5 |
| 6,673,520 B2 | 1/2004 | Han et al. | |
| 6,686,101 B2 * | 2/2004 | McCullough | 430/5 |
| 6,740,159 B2 | 5/2004 | Kandler et al. | 117/19 |
| 6,797,439 B1 | 9/2004 | Alpay | |
| 6,869,734 B1 | 3/2005 | Lyons et al. | |
| 6,872,497 B1 | 3/2005 | Levinson et al. | |
| 6,890,688 B2 * | 5/2005 | Mancini et al. | 430/5 |
| 7,271,950 B1 * | 9/2007 | Gordon et al. | 359/359 |
| 2003/0165749 A1 | 9/2003 | Fritze et al. | |

OTHER PUBLICATIONS

Uta-Barbara Goers, "Fluence-Dependent Transmission (FDT) of Calcium Fluoride" SPIE Conference 2002.
U.S. Appl. No. 11/231,550 to William Volk et al., entitled "Films for Prevention of Crystal Growth on Fused Silica Substrates for Semiconductor Lithography" filed Sep. 21, 2005.
Non-Final Office Action dated Sep. 3, 2008 for U.S. Appl. No. 11/231,550, 14 pages.
Final Office Action dated Feb. 19, 2009 for U.S. Appl. No. 11/231,550, 15 pages.

* cited by examiner

*Primary Examiner*—Stephen Rosasco
(74) *Attorney, Agent, or Firm*—Joshua D. Isenberg; JDI Patent

(57) ABSTRACT

Photolithographic masks and nano-imprint lithography masks with calcium fluoride substrates are disclosed. A photolithographic mask has a calcium fluoride substrate having a surface, a patterned layer disposed on the surface, and a polymer layer forming a pellicle that covers the patterned layer. A mask for nano-imprint lithography has a calcium fluoride substrate with a surface and a nano-imprint lithography pattern formed on the surface. Such masks can be used in a method for reducing the effects of hydration during lithography. In the method a layer of photoresist is formed on a substrate. A mask having a substrate made of calcium fluoride with a patterned surface is disposed proximate the layer of photoresist. The photoresist is exposed to radiation that passes through the mask. The radiation is characterized by a vacuum wavelength between about 190 nm and about 450 nm. Calcium fluoride masks can also be used to reduce the effects of hydration nano-imprint lithography.

21 Claims, 3 Drawing Sheets

USE OF CALCIUM FLUORIDE SUBSTRATE FOR LITHOGRAPHY MASKS

CROSS-REFERENCE TO RELATED APPLICATION

This application claims priority from co-pending provisional patent application Ser. No. 60/628,176, which was filed on Nov. 15, 2004, the entire disclosures of which are incorporated herein by reference.

FIELD OF THE INVENTION

This invention generally relates to photolithography masks and more particularly to prevention of problems associated with etch non-uniformity and/or hydration in photolithography masks.

BACKGROUND OF THE INVENTION

The semiconductor industry uses masks for photolithography techniques to form microscopic or sub-microscopic circuit elements such as integrated circuits. In photolithography, a semiconductor substrate is covered with a photoresist that reacts to exposure to radiation. Radiation from a source is focused onto the photoresist through a patterned mask. The mask typically has a mask substrate, a patterned later and a protective covering layer known as a pellicle. The pattern on the mask corresponds to a portion or layer of the desired integrated circuit. Portions of the photoresist that are exposed to the radiation react with light such that they are either easily removed (for a positive resist) or resistant to removal (for a negative resist), e.g., by a solvent. After removal of portions of the resist, a reduced image of the mask pattern is transferred to the photoresist. Portions of the substrate may then be etched through openings in the pattern on the photoresist. Alternatively, material may be deposited on the substrate through the openings in the photoresist. The size of the features on the photoresist pattern is limited by diffraction. As successive generations of integrated circuits require smaller and smaller circuit features, shorter wavelengths of radiation must be used. The use of shorter wavelengths can have an undesirable impact on the material used as the mask substrate.

Nano-imprint lithography is based on embossing adapted to the needs of semiconductor processing. Nano-imprint lithography is essentially a micromolding process in which the topography of a template patterns a photoresist on a wafer. In photolithography, by contrast, the resist is patterned by optical exposure and development. Unlike photolithography, imprint lithography does not use reduction optics. Instead, the size of the template determines the size of the pattern. Thus masks for nano-imprint lithography are often referred to as 1× masks. One advantage of nano-imprint lithography is that the parameters that limit resolution in classic photolithography (including wavelength and numerical aperture) do not apply. Nano-imprint lithography resolution is typically limited only by the resolution of the template fabrication process.

Calcium Fluoride ($CaF_2$) is a crystalline material that has been proposed for future 157-nm photolithography applications due to its preferable transmission characteristics at that wavelength. Specifically, the presence of water in the mask substrate interferes with the transmission of the 157-nm radiation. $CaF_2$ masks were proposed since they provide a substantially water-free environment. Unfortunately, photo masks for 157-nm photolithography require a quartz pellicle since the 157-nm radiation tends to destroy the polymers commonly used as a pellicle material. Thus $CaF_2$ masks for 157-nm photolithography are relatively expensive compared to conventional photo masks. Development programs for 157-nm lithography have been stopped and engineering development resources focused on 193-nm immersion photolithography using fused silica mask substrates.

Amorphous fused silica is widely used today for mask substrates for photo lithography and is used currently in develop of 1× masks for nano-imprint lithography. The primary advantages of fused silica are its cost and transmission properties for photolithography down to 193-nm, wavelengths. However, when fused silica is etched, the etch depth can lack uniformity due to the amorphous structure of fused silica. When fused silica masks are etched at 193-nm etch depths, as they are for 193-nm photo-lithography alternating phase shift (altPSM) or chromeless phase lithography (CPL) mask designs, the non-uniformity of etch depth will change the phase characteristics of the mask and cause non-uniformity of the line width on the resist wafer. This in the end will change device performance because the transistor level gate lengths will have non-uniformity across the layout of the device. Also, fused silica is used as a 1× mask substrate for nano-imprint lithography. At 1× lithography the mask features are typically four times smaller than photo masks used in 4× reduction photolithography. These nano-imprint masks are patterned by etching the features onto the mask surface. These features are much smaller than traditional photomask features, and thus are susceptible to etch non-uniformity caused by voids and nano-fractures in the amorphous fused silica. This results in high densities of point defects on line edges and edge roughness on these small 1× structures on nano-imprint masks.

Thus, there is a need in the art, for lithography masks that overcome these disadvantages.

SUMMARY OF THE INVENTION

The disadvantages associated with the prior art are overcome by embodiments of the invention directed to lithographic masks and methods that use calcium fluoride as a mask substrate. Photolithographic masks and nano-imprint lithography masks with calcium fluoride substrates are disclosed. A photolithographic mask has a calcium fluoride substrate having a surface, a patterned layer disposed on the surface, and a polymer layer forming a pellicle that covers the patterned layer. A mask for nano-imprint lithography has a calcium fluoride substrate with a surface and a nano-imprint lithography pattern formed on the surface.

Masks made of calcium fluoride can also be used in a method for reducing the effects of hydration during lithography. In the method a layer of photoresist is formed on a substrate. A mask with a mask substrate made of calcium fluoride with a patterned surface is disposed proximate the layer of photoresist. The photoresist is exposed to radiation that passes through the mask. The radiation is characterized by a vacuum wavelength between about 190 nm and about 450 nm.

Lithography masks and methods based on calcium fluoride exhibit desirable optical properties, desirable etch properties and cost competitiveness suitable to meet the requirements for photolithography and nano-imprint lithography at relatively small (e.g., less than 90 nm) design rules.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Figure 1:
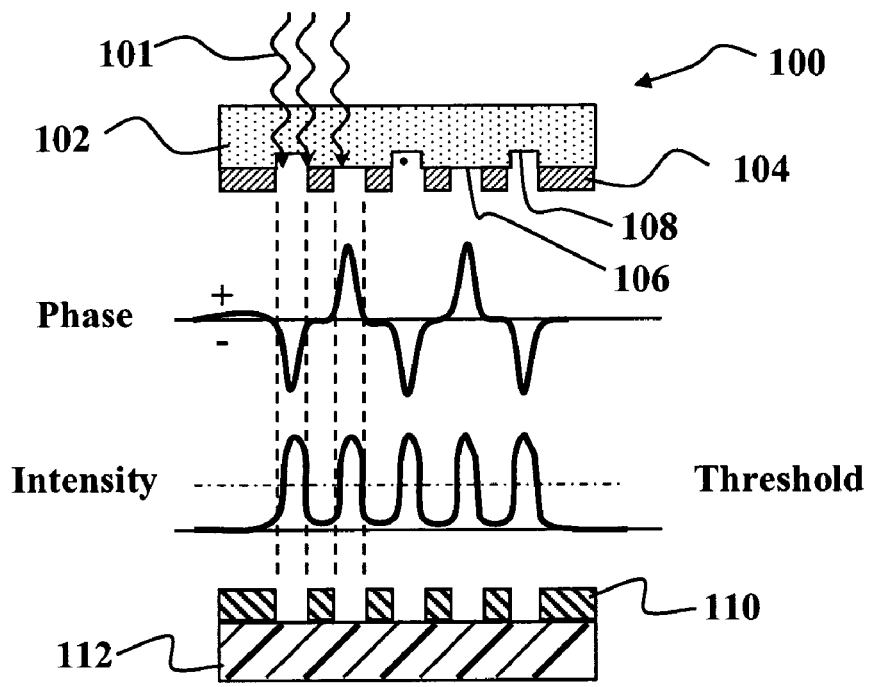
FIG. 1 is a cross-sectional schematic diagram illustrating the use of an alternating phase shift mask (altPSM) according to an embodiment of the present invention.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Calcium Fluoride is a crystalline structure without common voids and nano-fractures such as are found in fused silica. Thus, calcium fluoride offers better etch properties for achieving good uniformity of etch depth. This makes calcium Fluoride is a desirable substrate for 1) 193-nm photolithography altPSM and CPL applications in photolithography, and 2) 1× masks for nano-imprint lithography. Calcium fluoride suitable for lithography mask substrates can be readily obtained commercially, e.g., from Corning Incorporated, Fluoride Crystals Business of Brookfield, Mass. and other suppliers.

Embodiments of the present invention are directed to the application of Calcium Fluoride ($CaF_2$) as a substrate of masks used in lithography techniques such as Alternating Phase shift photo-masks (altPSM) at 193 nm lithography and 1× masks for nano-imprint lithography. An advantage of Calcium Fluoride for altPSM and CPL applications at 193-nm photo-lithography over fused silica is its consistent etch speed and uniform etch depth in both the vertical etch depth direction and the sidewall etch direction. The same advantage applies to 1× masks for nano-imprint lithography. Although there are other materials like $CaF_2$ that offer better etch performance compared to fused silica, no other material also has combination of etch properties, optical properties and the competitive cost of $CaF_2$ to meet the requirements for photo-lithography and nano-imprint lithography.

A further advantage of $CaF_2$ over fused silica for altPSM, CPL and nano-imprint lithography, particularly for use with 193 nm and 248 nm radiation, arises from the fact that $CaF_2$ can provide a nearly water-free environment. Although water does not affect transmission at 193 nm and 248 nm, it has been discovered in development of embodiments of the present invention that exposure to radiation at these wavelengths (particularly 193 nm) causes fused silica to dehydrate. The dehydration activates the fused silica surface causing it to act as a catalyst for many different photochemical reactions. Such reactions can produce compounds such as ammonium sulfate, ammonium carbonate, ammonium carbamate, cyanuric acid, silicic acid, ammonium silicate, poly(methyl methacrylate), poly(butyl methacrylate), poly(methacrylic acid), polyvinyl chloride), poly(vinylidene chloride), sodium chloride and potassium chloride. Many of these compounds form crystals on the fused silica. Such crystal growth has not previously been regarded as a problem, most likely because the resulting crystals were small relative to the features on the mask. However, as photomasks and nano-imprint masks are developed for design rules of 90 nm or less, the size of the crystals becomes significant. This problem may be overcome through the use of $CaF_2$, water-free by design, as the mask substrate. By using $CaF_2$ as a mask substrate, the dehydration and resultant crystal growth on the surface of the mask substrate can be eliminated.

FIG. 1 illustrates the use of a $CaF_2$-based altPSM 100 according to an embodiment of the present invention uses alternating areas of chrome and 180 degree-shifted $CaF_2$ to form features on a wafer 112 that is covered by a layer of a resist 110. The altPSM 100 is made using a $CaF_2$ mask substrate 102 that is transparent to radiation 101. By way of example the radiation 101 may be characterized by a wavelength of about 193 nm or about 248 nm or some wavelength in between these two. The radiation passing through the mask imaged onto the resist layer 110 using an imaging system commonly known in the art. If the intensity at the radiation 101 impinging on the resist 110 is greater than a threshold, the resist will react. Chrome lines 104 on a mask substrate 102 are bordered on one side by regions 106 of the surface of the mask substrate of phase 0°, and on the other side by regions 108 of the surface of the mask substrate 102 that have been etched to a depth corresponding to a phase shift of 180° for radiation 101 that passes through the altPSM 100. The 0° regions 106 may be regions of a polished surface of the mask substrate 102. The 180° regions 108 may be in the form of trenches formed into the polished surface of the mask substrate 102. Alternatively, the 180° regions may be mesas of $CaF_2$ formed on the polished surface. Radiation passing through 0° regions 106 and 180° regions 108 interfere at the photoresist 110. As the phase goes from positive to negative, it passes through 0. The intensity (which is proportional to the square of the phase) of radiation impinging on the resist 110 also goes through 0, making a very dark and sharp line on the wafer 112 when the resist 110 is developed and the wafer 112 is etched.

Figure 2:
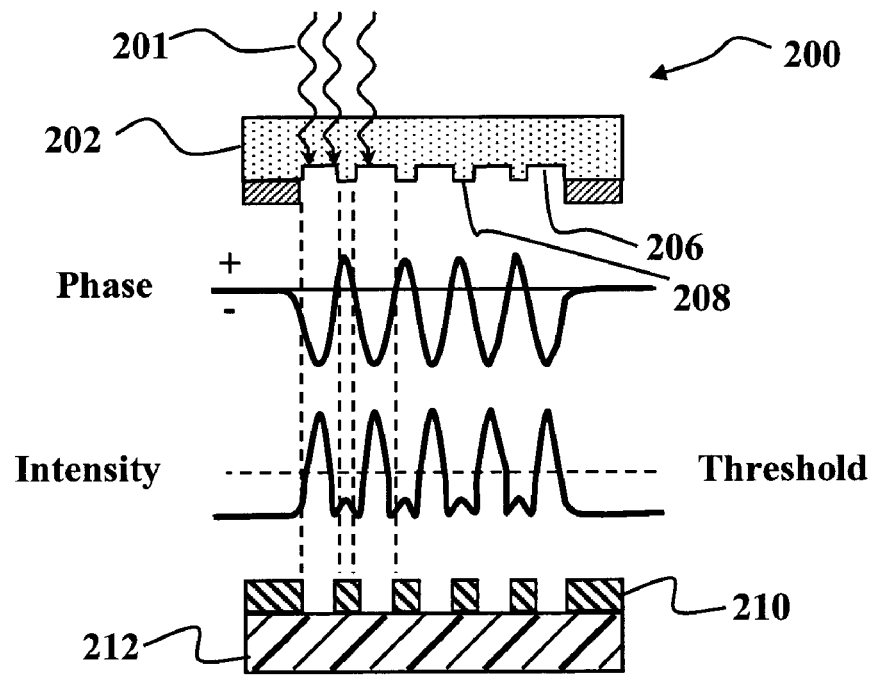
FIG. 2 is a cross-sectional schematic diagram of illustrating the use a chromeless phase lithography (CPL) mask according to another embodiment of the present invention.

In an alternative embodiment of the invention, $CaF_2$-based masks may be used for chromeless phase lithography. In a chromeless phase lithography (CPL) mask features are formed on the wafer by the diffraction edges between neighboring regions on the mask that are 180 degrees out of phase. FIG. 2 depicts the use of a $CaF_2$ CPL mask 200, where each shifted feature on the mask forms a line on a wafer 212 covered by a resist 210. The mask 200 generally has a calcium fluoride substrate 202 with a surface having one or more metal (e.g., chrome) lines that border a pattern of 0° regions 206 and 180° regions 208 (e.g., trenches or mesas) that are at different heights than the 0° regions 206. Radiation 201 imaged from different regions of the mask 200 interferes at the photoresist layer 210. By forcing the phase to go through 0, the intensity (proportional to the square of the phase) also goes through 0, making a very dark and sharp line on the wafer 212 when the resist 210 is developed and the wafer 212 is etched.

An additional advantage of the use of $CaF_2$ as a mask substrate for 193-nm and 248-nm processes arises from the material of the pellicle used to protect the mask pattern from particle contamination. Since 157-nm radiation can damage polymer pellicles, prior art $CaF_2$ photomasks designed for 157-nm lithography required quartz pellicles. However, 193-nm and 248-nm radiation does not damage polymer pellicles. Thus the pellicles for $CaF_2$ masks in embodiments of the present invention may be made of conventional polymers. Polymer pellicles for photolithography are available from Microlithography Incorporated of Sunnyvale, Calif.

Figure 3A:
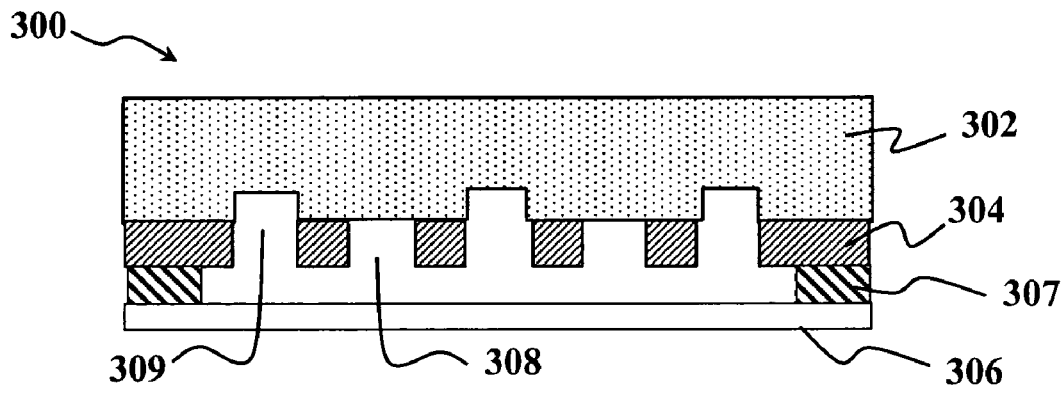
FIG. 3A is a cross-sectional schematic an alternating phase shift mask (altPSM) according to another embodiment of the present invention.
Figure 3B:
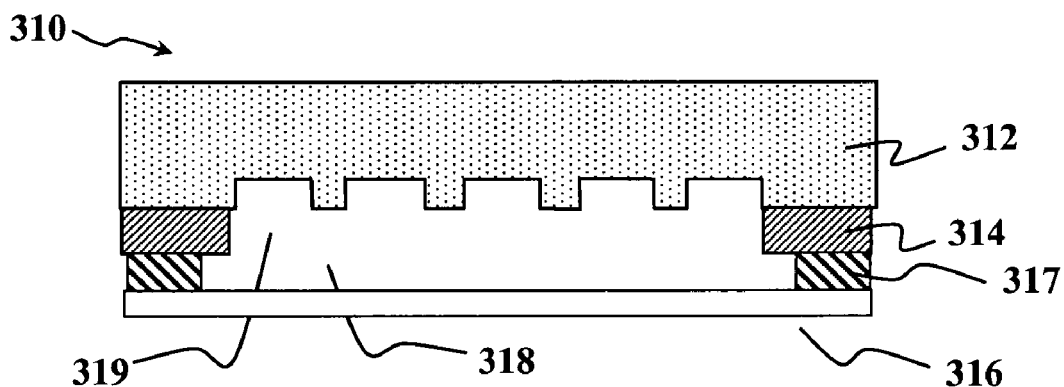
FIG. 3B is a cross-sectional schematic diagram of illustrating a chromeless phase lithography (CPL) mask according to another embodiment of the present invention.
Figure 3C:
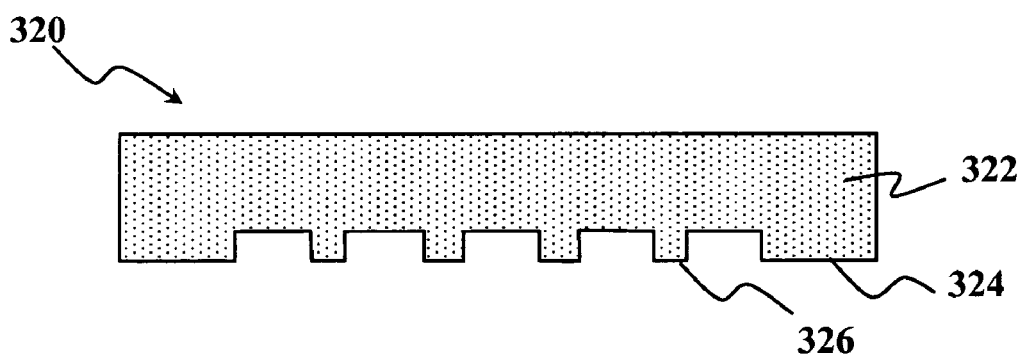
FIG. 3C is a cross-sectional schematic diagram of illustrating a nano-imprint lithography mask according to another embodiment of the present invention.

FIGS. 3A and 3B respectively depict an altPSM 300 and a CPL photomask 310 according to embodiments of the present invention. The altPSM 300 includes a $CaF_2$ mask substrate 302. By way of example the mask substrate 302 may be 6" by 6" by 0.25", a standard size used in the industry. A series of chrome lines 304 is disposed on a surface of the substrate 302 between 0° regions 308 and 180° regions 309, as described above with respect to FIG. 1. A pellicle 306 made of a polymer material is disposed over the pattern on the surface of the mask substrate 302. The pellicle 306 spaced apart from the substrate surface by a frame 307. The CPL mask 310 has a $CaF_2$ mask substrate 312 having a surface. One or more metal (e.g., chrome) lines that border a pattern of 0° regions 318 and 180° regions 319 formed on the surface. A pellicle 316 made of a polymer material, is disposed over the pattern on the surface of the CPL mask substrate 312 and spaced apart from the mask surface by a frame 317. When used with radiation having a vacuum wavelength between about 190 nm and about 250 nm (e.g., 193-nm and 248-nm radiation) the pellicles 306, 316 may be made of conventional polymers, e.g., fluoropolymers such as PTFE, and the like, typically used as pellicles. Examples of suitable polymers include amorphous per-fluoropolymers, such as Teflon AF® and Cytop®. Teflon is a registered trademark of E.I. Du Pont De Nemours And Company of Wilmington Del. Cytop is a registered trademark of Asahi Glass Corporation of Tokyo, Japan.

The same properties that make $CaF_2$ advantageous for use with altPSM and CPL at 193 nm and 248 nm also apply to other lithographic techniques. For example, nano-imprint lithography according to embodiments of the present invention uses a mask, e.g., a 1×mask, in the form of a template 320 made from a $CaF_2$ substrate 322 having a surface 324 characterized by a topographic pattern 326 of a portion of a device such as an integrated circuit, a pattern of or on a semiconducting device, a pattern of or on data storage media, a pattern on or of a passive optical device, or a pattern of or on an active optical device. The topographic pattern 326 may be formed by any technique suitable for fabricating features of the desired dimensions, such as conventional photolithography, electron beam lithography and the like. $CaF_2$ has certain advantages over quartz as a material for nano-imprint lithography masks. Etching quartz imprint masks to produce a topographic pattern can result in a variation of etch depth and/or width, each of which are deleterious in some applications. Avoiding such etch variation is an advantage of a $CaF_2$ imprint mask.

Note that unlike conventional photolithography masks, such as altPSM and CPL masks, the nano-imprint mask 320 does not require a pellicle. The $CaF_2$ surface 324, which may be covered with a release layer, is gently pressed into a thin layer of low viscosity, typically silicon-containing monomer. When illuminated by a UV lamp, the monomer is polymerized into a hard material. Upon separation of the template, a device pattern, e.g., an integrated circuit pattern, is left on the surface. A residual layer of polymer between features is eliminated by an etch process, and a perfect replica of the pattern is ready to be used in semiconductor processing for etch or deposition. Only the template fabrication process, typically accomplished with an e-beam writer, limits the resolution of the features. Features as small as 10 nm or less may be made using this type of technique.

Figure 4A:
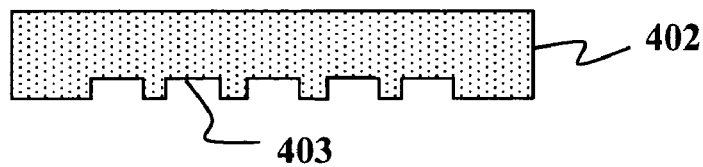
FIGS. 4A-4D are a sequence of cross-sectional schematic diagrams that illustrate nano-imprint lithography according to an embodiment of the invention.
Figure 4B:
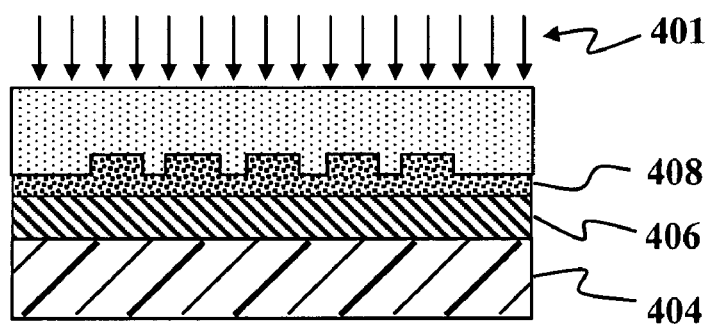
Figure 4C:
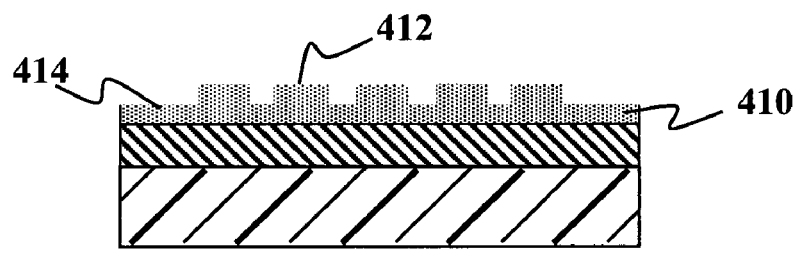
Figure 4D:
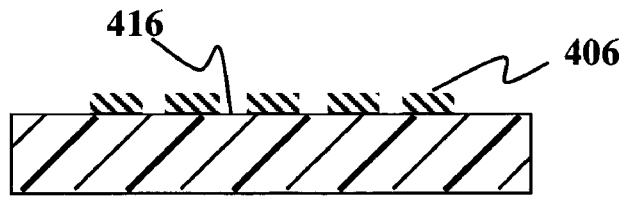

FIGS. 4A-4D illustrate an example of a typical nano-imprint lithography process sometimes referred to as "step and flash" imprint lithography (S-FIL™). S-FIL™ is a trademark of Molecular Imprints, Inc. of Austin, Tex. As shown in FIGS. 4A-4B, a transparent $CaF_2$ template 402 is lowered onto a substrate 404 covered with a photoresist 406 and a low-viscosity curable monomer 408, which fills the gaps in a pattern on a surface 403 of the template 402. When the monomer 408 is cured, it forms a hardened etch barrier 410. There are a number of different types of processes for curing (polymerizing) the monomer 408. For example, ultraviolet (UV) radiation, thermal curing may be used depending on the type of monomer material. Alternatively the image of the mask may be imprinted into a polymer material applied to the substrate through pressure transfer. In the example depicted in FIGS. 4B-4C, a UV-curable monomer 408 is used. Radiation 401, such as UV light having a vacuum wavelength in the UV range between about 235 nm and about 450 nm, e.g., about 365 nm, shining through the substrate 402 causes the monomer 408 to convert into a hardened etch barrier 410. The surface 403 may be coated with a release layer to facilitate removal of the template 402 from the etch barrier 410. Upon removal of the template 402, the etch barrier 410 covers the photoresist 406 in a pattern of thick barriers 412 separated by a thin residual layer 414. One etch removes the residual layer 414 to expose areas of the photoresist 406. A subsequent etch transfers the pattern to the photoresist as shown in FIG. 4D. The wafer 404 is now ready for deposition, etch, or implantation through openings 416 in the pattern of the photoresist 406.

Embodiments of the present invention provide lithographic masks having desirable etch and optical properties, few problems associated with hydration/dehydration and a favorable cost structure. The crystallinity of $CaF_2$ advantageous for both line edge roughness and etch depth control. The latter characteristic means better control over phase shift for such masks, therefore device yield. Furthermore, both characteristics are advantageous when $CaF_2$ is used for an imprint template. The use of $CaF_2$ lithographic masks in association with 193-nm or 248-nm radiation allows cost-effective implementation of 90-nm or smaller design rules for the next generation of semiconductor processing. Although examples of altPSM, CPL and nano-imprint masks are described for the sake of example, embodiments of the invention is are not limited to using $CaF_2$ masks for just these lithographic techniques.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A photolithographic mask, comprising:
   a calcium fluoride substrate having a surface;
   a patterned layer disposed on the surface; and
   a pellicle having a polymer layer that covers the patterned layer.

2. The mask of claim 1 wherein the mask is a chromeless phase lithography mask.

3. The mask of claim 1 wherein the mask is an alternating phase shift mask.

4. The mask of claim 1 wherein the patterned layer is patterned for a design rule of about 90 nm or less.

5. The mask of claim 1 wherein the polymer layer is of a type that is compatible with photolithographic processes that use radiation having a vacuum wavelength between about 190 nm and about 450 nm.

6. The mask of claim 5 wherein the polymer layer includes an amorphous per-fluoropolymer material.

7. A method for reducing the effects of hydration during lithography, comprising, the steps of:
   forming a layer of photoresist on a substrate;
   disposing a mask having a mask substrate made of calcium fluoride proximate the layer of photoresist, the mask having a patterned surface; and
   exposing the photoresist to radiation that passes through the mask, wherein the radiation is characterized by a vacuum wavelength between about 190 nm and about 450 nm.

8. The method of claim 7 wherein the mask is a chromeless phase lithography mask.

9. The method of claim 7 wherein the mask is an alternating phase shift mask.

10. The method of claim 7 wherein the mask is a nano-imprint lithography mask.

11. The method of claim 10 wherein the mask is a 1× nano-imprint lithography mask.

12. The method of claim 10 wherein disposing a mask having a mask substrate made of calcium fluoride proximate the layer of photoresist includes impressing the patterned surface of the mask into the photoresist or a layer of material disposed on the photoresist.

13. The method of claim 12 wherein the layer of material disposed on the photoresist includes a UV-curable monomer.

14. The method of claim 13, further comprising the step of curing the monomer.

15. The method of claim 7 wherein the radiation has a vacuum wavelength of about 193 nm.

16. The method of claim 7 wherein the radiation has a vacuum wavelength of about 248 nm.

17. The method of claim 7 wherein the radiation has a vacuum wavelength of less than about 365 nm.

18. The method of claim 7 wherein the patterned surface contains a pattern for a design rule of 90 nm or less.

19. The method of claim 7 wherein the mask includes a pellicle having a polymer layer that covers the patterned surface.

20. The method of claim 19 wherein the polymer layer is of a type that is compatible with photolithographic processes that use radiation having a vacuum wavelength between about 190 nm and about 450 nm.

21. The method of claim 20 wherein the polymer layer includes an amorphous per-fluoropolymer material.

* * * * *